United States Patent [19]

Scifres et al.

[11] Patent Number: 4,831,630
[45] Date of Patent: May 16, 1989

[54] PHASED-LOCKED WINDOW LASERS

[75] Inventors: Donald R. Scifres, Los Altos; William Streifer; Robert D. Burnham, both of Palo Alto, all of Calif.

[73] Assignee: Xerox Corporation, Stamford, Conn.

[21] Appl. No.: 123,485

[22] Filed: Nov. 20, 1987

Related U.S. Application Data

[62] Division of Ser. No. 484,827, Apr. 14, 1983, abandoned.

[51] Int. Cl.$^4$ ............................................. H01S 3/19
[52] U.S. Cl. ..................................... 372/50; 372/45; 372/46; 372/48
[58] Field of Search ....................... 372/50, 45, 46, 48

[56] References Cited

U.S. PATENT DOCUMENTS

| | | | |
|---|---|---|---|
| 4,255,717 | 3/1981 | Scifres et al. | 372/50 |
| 4,282,494 | 8/1981 | Yonezu et al. | 332/94.5 H |
| 4,309,668 | 1/1982 | Ueno et al. | 331/94.5 H |
| 4,371,966 | 2/1983 | Scifres et al. | 372/45 |

FOREIGN PATENT DOCUMENTS 69563 1/1983 European Pat. Off. .

OTHER PUBLICATIONS

N. G. Basov et al., "Synchronization of Oscillations in a Semiconductor Laser Having Several p-n Junctions", *Soviet Physics-Solid State*, vol. 7(1), pp. 275-276, Jul. 1965.
N. G. Basov et al., "Diffraction Synchronization of Lasers", *Soviet Physics-Solid State*, vol. 10(6), pp. 845-850, Dec. 1965.
S. Yamamoto et al., "High Power CW Operation in Visible Spectral Range by Window V-Channeled Substrate Inner Stripe Lasers", *Applied Physics Letters*, vol. 42(5), pp. 406-408, Mar. 1, 1983.
J. P. van der Ziel et al., "Integrated Multilayer GaAs Lasers Separated by Tunnel Junctions", *Applied Physics Letters*, vol. 41(6), pp. 499-501, Sep. 15, 1982.
Scifres et al., "Phase-Locked Semiconductor Laser Array", *Applied Physics Letters*, vol. 33(12), pp. 1015-1017, Dec. 15, 1978.
J. Katz et al., "Diffraction Coupled Phase-Locked Semiconductor Laser Array", *Applied Physics Letters*, vol. 42(7), pp. 554-556, Apr. 1, 1983.

*Primary Examiner*—James W. Davie
*Attorney, Agent, or Firm*—W. Douglas Carothers, Jr.

[57] ABSTRACT

A laser in which the central portion is provided with current pumping means consisting of an array of current confining stripe contacts to provide a multiple emitter active layer and the end sections of the laser are provided with transparent waveguides. The active layer of this laser can be abruptly stepped along the direction of light propagation, or provided with tapered end couplers, or in any other way made transparent, so that light escapes from the emitters of the active layer of the central portion of the laser into the transparent waveguides at the ends of the laser. The transparent waveguides are of a non-absorbing material of higher bandgap than the central active layer material, or of the same material but otherwise rendered transparent, so that the escaping light strikes the mirror facets and is reflected back, whereby a portion of the reflected light couples back into its emitter and provides the optical feedback for laser operation. Phase-locking is achieved because when the light from each emitter under each pumped stripe region emerges into the transparent waveguides, there is less or no lateral waveguiding, and therefore the light from each emitter diverges. Because of this divergence, when this light strikes the mirror facets, portions of the light from each emitter are reflected back into other adjacent emitters, thus phase-locking the laser output and making it highly collimated. Relative to conventional multi-emitter lasers, five to ten times higher output powers from the collimated beam are obtained, such increase in power occurring because the material at the laser mirror surface is transparent to the active region radiation and therefore is not damaged by the very intense light.

15 Claims, 9 Drawing Sheets

PHASED-LOCKED WINDOW LASERS

This is a division of application Ser. No. 484,827, filed Apr. 14, 1983, now abandoned.

BACKGROUND OF THE INVENTION

U.S. Pat. No. 4,255,717 described multi-emitter lasers in which means are provided for a portion of the optical wave established in any one emitting region or cavity of the active layer to be deflected, reflected, scattered, diffracted or refracted and coupled into one or more adjacent emitting cavities of the active layer. This coupling of light into other emitting cavities in the active layer of the laser provides a phase-locking array of laser cavities capable of emitting very high output powers. Lasers with still greater output powers are desired, and such phase-locked array lasers are the subject of this invention.

SUMMARY OF THE INVENTION

In accordance with the invention, a laser is disclosed in which the central portion of the laser is provided with current pumping means consisting of an array of current confining stripe contacts to provide a multiple emitter active layer and the end sections of the laser are provided with transparent waveguides. The active layer of this laser can be abruptly stepped along the direction of light propagation, or provided with tapered end couplers, or in any other way made transparent, so that light escapes from the emitters of the active layer of the central portion of the laser into the transparent waveguides at the ends of the laser. The transparent waveguides are of a non-absorbing material of higher bandgap than the central active layer material, or of the same material but otherwise rendered transparent, so that the escaping light strikes the mirror facets and is reflected back, whereby a portion of the reflected light couples back into its emitter and provides the optical feedback for laser operation. In contrast to the laser described in U.S. Pat. No. 4,255,717, phase-locking between adjacent emitter may be achieved without coupling regions between the stripe contacts. In the disclosed laser, phase-locking is achieved because when the light from each emitter under each pumped stripe region emerges into the transparent waveguides, there is less or no lateral waveguiding, and therefore the light from each emitter diverges. Because of this divergence, when this light strikes the mirror facets, portions of the light from each emitter are reflected back into other adjacent emitters, thus phase-locking the laser output and making it highly collimated. Relative to conventional multi-emitter lasers, five to ten times higher output powers from the collimated beam are obtained, such increase in power occurring because the material at the laser mirror surface is transparent to the active region radiation and therefore is not damaged by the very intense light. Thus, a laser is provided which yields a very high power, collimated output beam, which would be extremely useful in high power applications.

DETAILED DESCRIPTION OF THE INVENTION

Figure 1A:
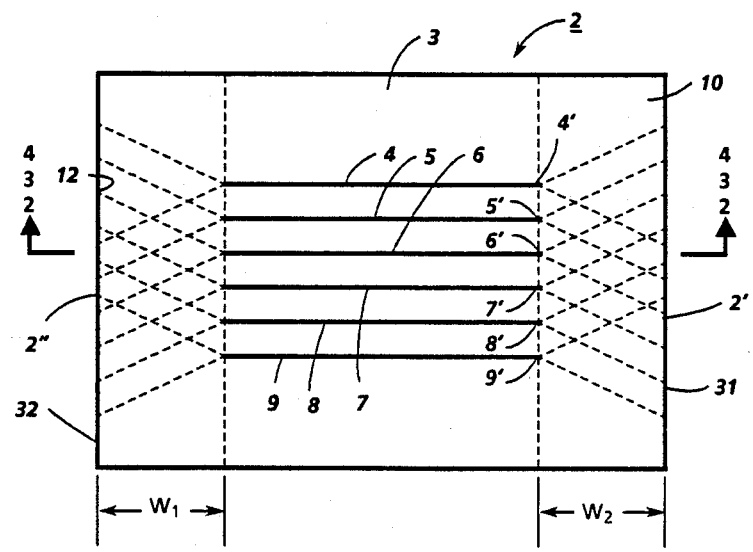
FIGS. 1a-1g are top views of high power, multi-emitter phase-locked window lasers in accordance with the invention.

Referring to FIG. 1a, there is schematically shown a top view of a monolithic multi-contact laser device 2 in accordance with the invention. Laser 2 consists of a central section 3 having multiple, parallel disposed contacts 4–9 for providing multiple emitters 4'–9', and transparent waveguide window end sections 10 and 12 for providing coupling of the light emitted by the multiple emitters such that there is phase-locking of the light emitted by the multiple emitters. In this realization of the invention, phase-locking of the multiple emitters 4'–9' occurs due to diffractive coupling of the light. That is, when light emerges from a small aperture, it diverges. As shown in FIG. 1a, this diverging light strikes the laser mirror surfaces 31 and 32 and is partially reflected, causing light from one emitter 4'–9' to be partially coupled into adjacent emitters 4'–9'.

Figure 1B:
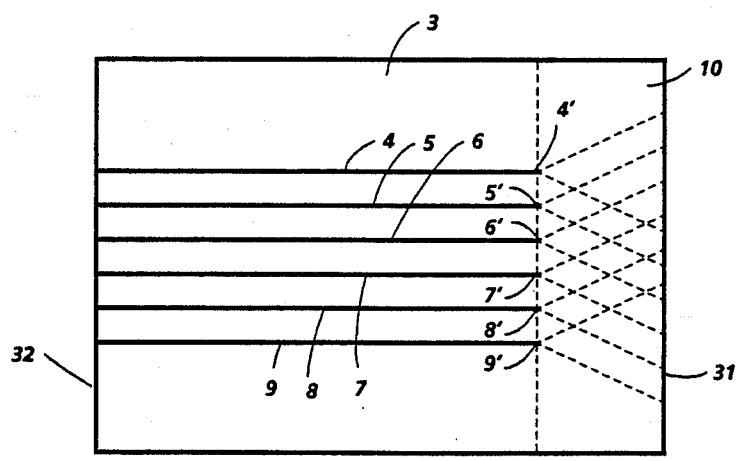

Other configurations of the window phase-locked multiple emitter laser and lateral waveguide patterns are also possible. Several examples are shown in FIGS. 1b-1g. In FIG. 1b, a window section or region 10 is produced adjacent to only one mirror surface 31 rather than two, as in FIG. 1a. The opposite mirror 32 may be coated with a reflecting material such as a dielectric stack or metallic reflector (not shown) so that light emerges from only mirror surface 31. Alternatively, the widths $W_1$ and $W_2$ of window regions 10 and 12 shown in FIG. 1a need not be equal and can be varied to produce variations in the degree and phase of coupling between emitters.

Figure 1C:
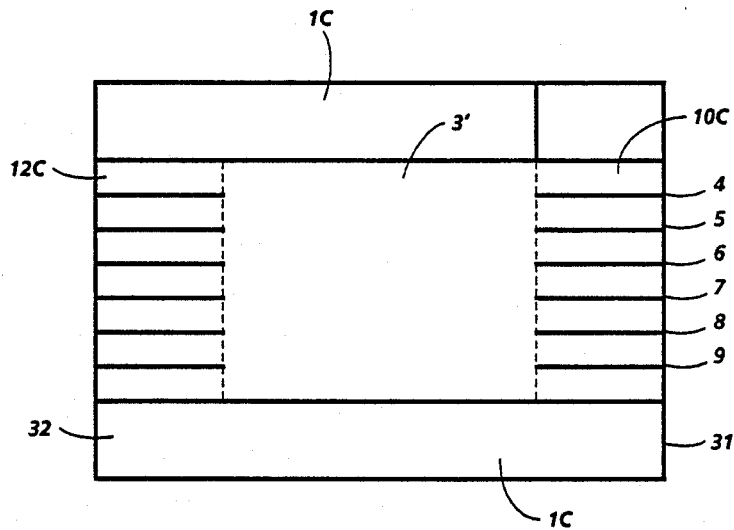

In FIG. 1c, the central lasing region 3' is uniformly pumped with no lateral waveguidance mechanism while the window regions 10c and 12c adjacent to mirror surfaces 31 and 32 have lateral spatial variations. Such lateral spatial variations, which lead to lateral confinement of the laser beam (and the subsequent diffractive effect), can be produced either by a current confinement mechanism (such as proton implant) in regions 10c and 12c or by a real refractive index lateral waveguide in regions 10c and 12c. Real refractive index guides which are transparent to light from the central region can be produced as described by Yamamoto, et al in Appl. Phys. Lett. 42, 406, (1983) or by other means known in the art. Regions 1c outside of the central uniformly pumped region are left unpumped while window regions 10c and 12c may be left unpumped or alternatively might be electrically excited.

Figure 1D:
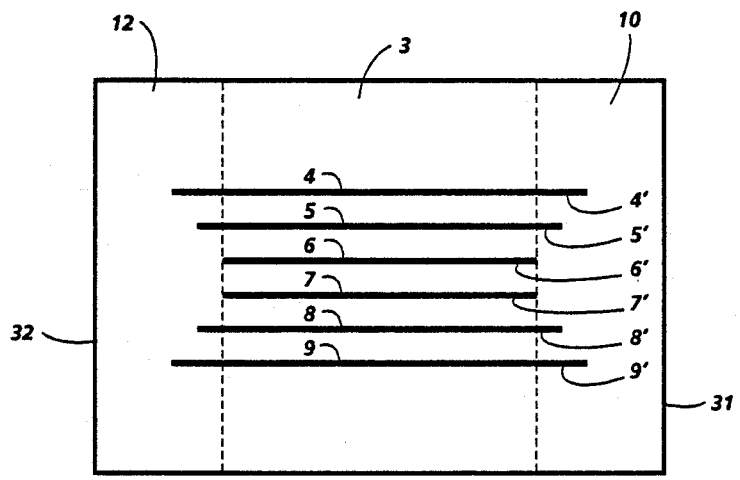
Figure 1E:
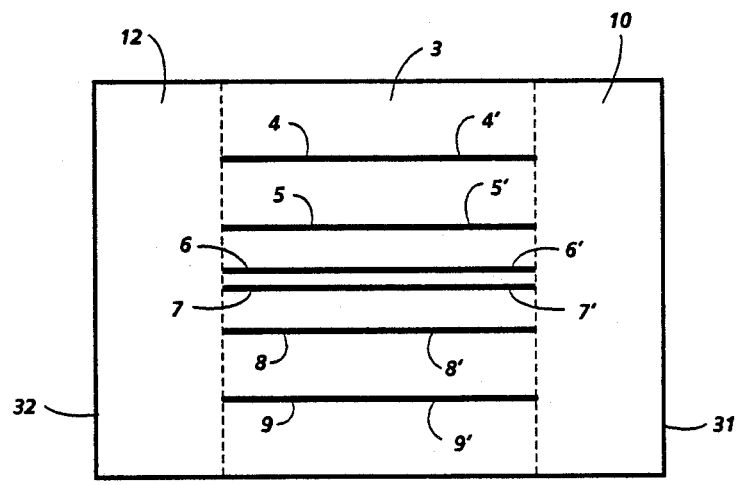

In FIG. 1d, the phase-locked window laser has contacts 4–9 of different lengths and corresponding central emitters 4'–9' of different lengths. FIG. 1e shows a still further embodiment of the invention in which unequally spaced contacts 4–9 provide multiple emitters 4'–9' that are not equally spaced. Alternatively the emitting regions of the embodiments of FIGS. 1a, 1b, 1d and 1e can be of unequal width.

Figure 1F:
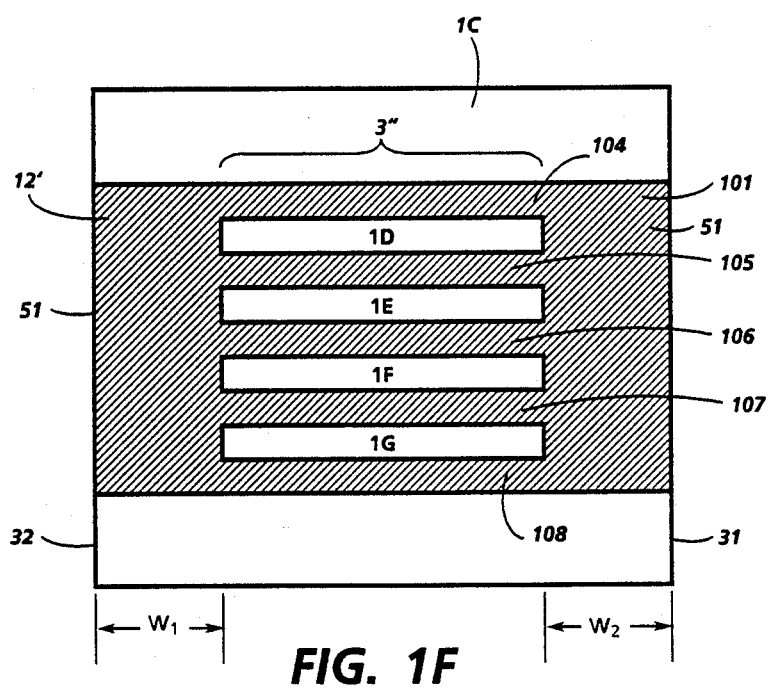

FIG. 1f shows a still further embodiment of the invention in which transparent window regions 10' and 12' are created by an injected current distribution profile rather than by a change in material composition, thickness, impurity content or spatial position. That is, hatched end regions 51 and interconnecting channels 104–108
are electrically pumped while regions 1d–1g are not excited. Owing to the resistance created by the narrow pumping channels 104–108, the average charge density is higher in regions 51 as compared to the peak charge density in the pumped channels 104–108. This is especially true in the case of proton implanted lasers. This charge and gain distribution causes the laser to operate at a wavelength characteristic of the gain in the central region 3" rather than end regions 51. In fact, since end regions 51 are pumped to a higher charge density, they will be more transparent to the light generated in the central laser section 3" than would be the case if seconds 1d–1g extended the entire length of the laser; i.e., from mirror 31 to mirror 32. That is, regions 10' and 12' act as window regions owing to the higher charge density in these regions. In a practical application, the widths $W_1$ and $W_2$ might be approximately 10 microns-100 microns while the width of the pumped region stripes 104–108 might be approximately 2-5 microns with a separation of approximately 7–10 microns or even greater. This laser is very simple to form on any type of heterostructure laser since it depends only on confining the current as shown in FIG. 1f. Any means for current confinement such as diffusion, oxide stripe or proton implant will work with greater variation in gain provided by a method which gives a large resistance change between the stripe regions 104–108 and the transparent regions 10' and 12'.

Figure 1G:
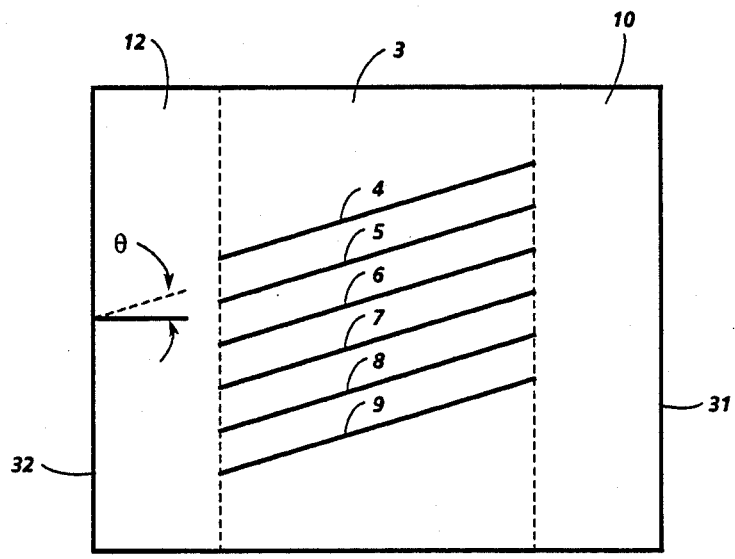

Still another realization of the invention is shown in FIG. 1g in which the contacts 4–9 are oriented at an angle $\theta$ to the facets. All may be at the same angle, the angles may differ, and other variations as described in connection with FIGS. 1a–1f are possible.

Figure 2:
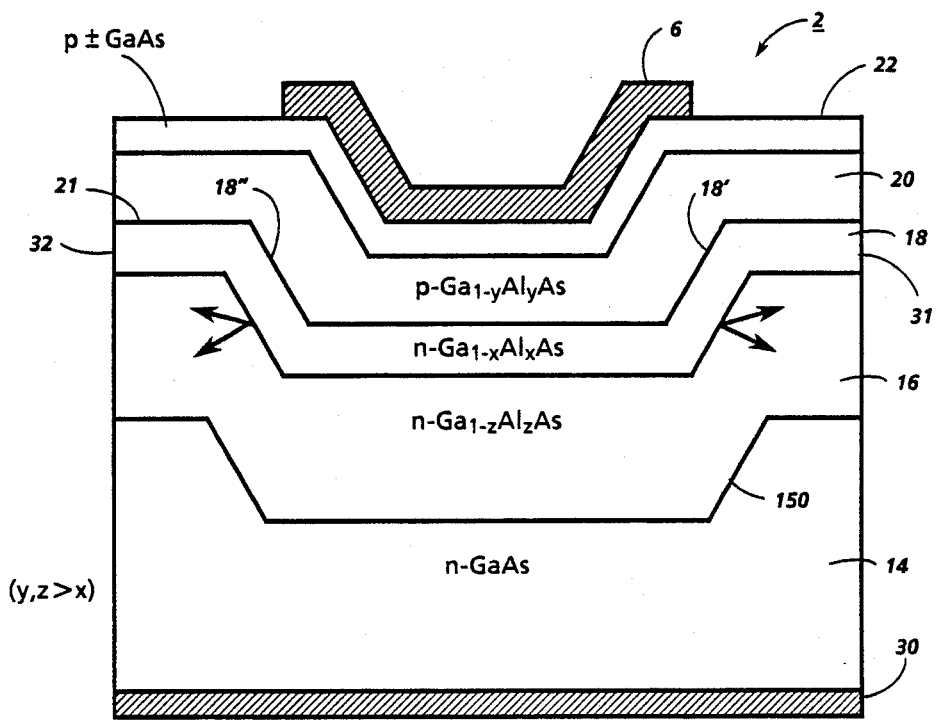
FIGS. 2 through 6 illustrate examples of various waveguiding layering and of the contour of those layers that could make up the lasers of FIGS. 1a-1g.

In all configurations shown (FIGS. 1a–1g), one or both window end regions is formed by changing the active layer thickness, the material composition, the doping content of the active region or the spatial position of the active region. An example in which the spatial position of the active layer is changed is shown in FIG. 2. As shown, laser 2 is grown on an n-GaAs substrate 14 into which a central channel 150, having a width corresponding substantially to the length of contacts 4–9, is etched or otherwise formed. Deposited on the substrate 14 are layers 16, 18, 20 and 22 which may respectively comprise n-$Ga_{1-z}Al_zAs$, n-$Ga_{1-x}Al_xAs$, p+-$Ga_{1-y}Al_yAs$ and p+-GaAs, where y and z are greater than x and x may be zero, making layer 18 the active layer with the highest index of refraction and the lowest bandgap and providing a vertical waveguide, comprised of high bandgap layers 16 and 20, for light waves propagating along the plane of the p-n heterojunction 21. Specifically, x can be 0.05 and y and z can be 0.30, layers 16 and 20 can be approximately 1-2 microns thick, layer 22 can be approximately 0.5 microns thick, while active layer 18 can be approximately 0.1 microns thick. As well recognized in the art, the conductivity type of the various layers may be reversed, and the light emitting layer 18 may be composed of multiple emitting layers as in multiple quantum well lasers, which is also true for later described embodiments.

Fabrication of the laser 2 of FIG. 2 is completed by deposition of the contacts 4–9. The desired contact stripe geometry is provided by first forming the desired contact geometry in a photolithographic mask, followed by proton implantation to make the surrounding region semi-insulating. This is followed by deposition of the contact material such that parallel contacts 4–9 are provided. It is noted that contacts 4–9, which may be gold or chromium, extend over only the central section 3 of the laser 2. Also, the bottom surface of substrate 12 is metalized to provide a contact 30, which may be a gold-tin alloy. After contact deposition, the ends 2' and 2" of laser 2 are provided with cleaved mirror facets 31 and 32, which may then be coated to protect the facets and/or modify their reflectivity.

The pump current confining channel geometry shown in FIG. 1 comprises six parallel contact stripes 4–9. The number of contact stripes is significant from the point of desired power output. Increasing the number of stripes will proportionally increase the optical output power. Upon current pumping, an emitting cavity is provided in active layer 18 below each contact stripe. Contact stripe separation from center to center may typically be from 2 microns to 25 microns and stripe width may typically be from 1 micron to 6 microns.

The channel region 150 runs perpendicular to the direction of optical propagation established within the laser cavities pumped by contacts 4–9 so that when layers 16, 18, 20 and 22 are grown stepped regions occur in these layers, and, of most interest, in the active region layer 18. The stepped regions 18' and 18" of the active layer of each emitter are stepped abruptly along the direction of light propagation in the active layer so that a significant portion of the light escapes from each laser emitter through the stepped regions 18' and 18", as shown in FIG. 2. This escaped light then propagates in the non-absorbing wider bandgap material of layer 16 adjacent each emitter until it strikes the cleaved mirror facets and is reflected back, with the portion of the reflected light striking the facets at a normal angle being reflected (coupled) back into the active region from which it was emitted thereby providing optical feedback for laser operation.

Phase-locking is achieved because when the light from each laser emitter under each pumped stripe region emerges into the transparent waveguide section (those sections of layer 16 adjacent each emitter) there is little or no lateral waveguiding (along the plane of the p-n junction 21) and therefore, the light from each emitter diverges. Because of this divergence, when the escaped light strikes the cleaved mirror facets at non-normal angles, a portion of the escaped light from one emitter is reflected back and into one or more adjacent emitters, thus phase-locking the output of laser 2 and making the output highly collimated. Five to ten times higher output power from this collimated beam are obtained compared to the phase-locked laser of U.S. Pat. No. 4,255,717, because the material adjacent the mirror facets is of a bandgap transparent to the emitted radiation.

Of course, some of the emitted light is partially reflected at the steps 18' and 18" within the crystal. If the steps are approximately perpendicular to the active layer, then the amount of reflection at the steps is quite small, a maximum of approximately 2%, based on the refractive index differences between the material of active layer 18 and the relatively wide bandgap material of layer 16. If, however, the steps are more angled, more light wil be reflected at the steps until the angles reach that reqired for total internal reflection. Thus, more perpendicular steps are desired, although total internal reflection is not reached even at 45° angles because of the small change in refractive index between the materials of layers 16 and 18. Also, a thin active region which has a low optical overlap with the lasing mode will allow the light to propagate more readily into the wider bandgap material.

It is noted that because there is no vertical waveguide structure in the laser of FIG. 2, the emitted light spreads rapidly in the wider bandgap material of layer 16. This allows extremely high optical output powers to be reached since catastrophic mirror facet degradation is related to power density on the mirror facets. However, because of the beam spread the amount of reflected light coupled back into adjacent emitters for phase-locking can be quite small if the distance between the stepped portions of the emitters and the mirror facets becomes substantially greater than 10 microns.

Figure 3:
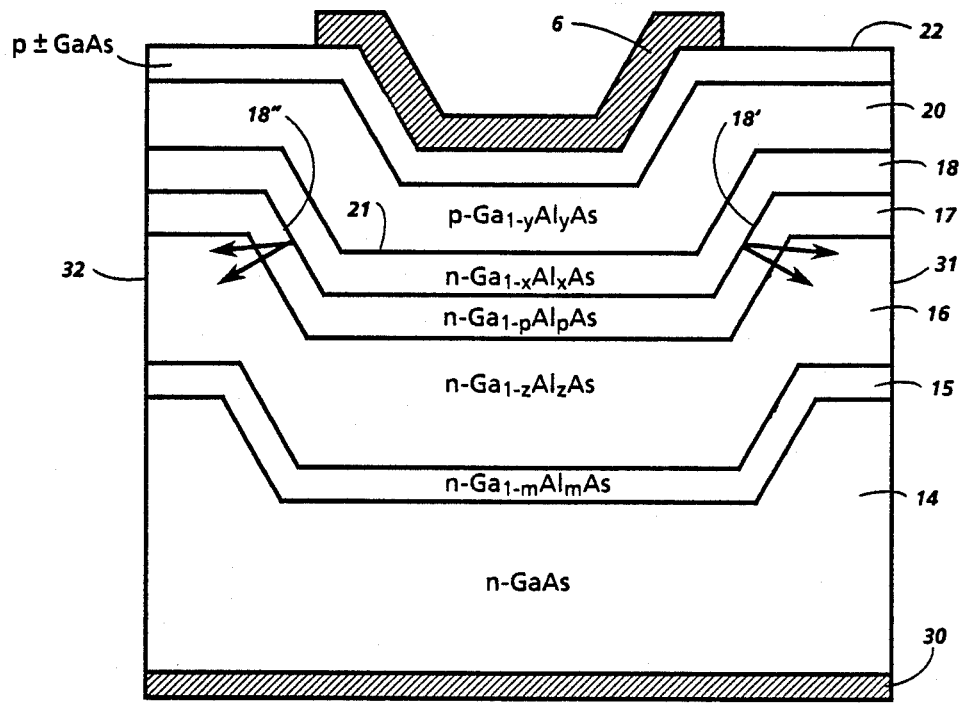

In order to avoid substantial threshold increases when the mirrors are more widely separated from the steps, a vertical waveguide structure can be provided, as shown in FIG. 3. In FIG. 3, a twin waveguide structure, comprised, for example, of layers 15 and 17, which respectively can be n-$Ga_{1-m}Al_mAs$ and n-$Ga_{1-p}Al_pAs$ having respective thicknesses of approximately 1 micron and approximately 0.1–0.5 micron, where y, p, m>z>x, is added to the laser of FIG. 2 so that when the light escapes from each emitter through the stepped portions thereof, it is confined by the vertical waveguide layers 15 and 17 so that it propagates in the wider bandgap material 16 adjacent the stepped portions. Thus, the light is confined as it propagates to and is reflected from the mirror facets. This structure does not inhibit phase-locking and still allows extremely high output powers since the transparent waveguide might be as much as 10–20 times thicker than the active region, thus allowing greater than 10–20 times higher output power without a substantial threshold increase and with much reduced sensitivity of threshold on the separation of the mirrors from the stepped portions of the active region. Specifically, layers 15 and 17 can be n-$Ga_{0.6}Al_{0.4}As$ and n-$Ga_{0.7}Al_{0.3}As$, respectively.

Figure 4:
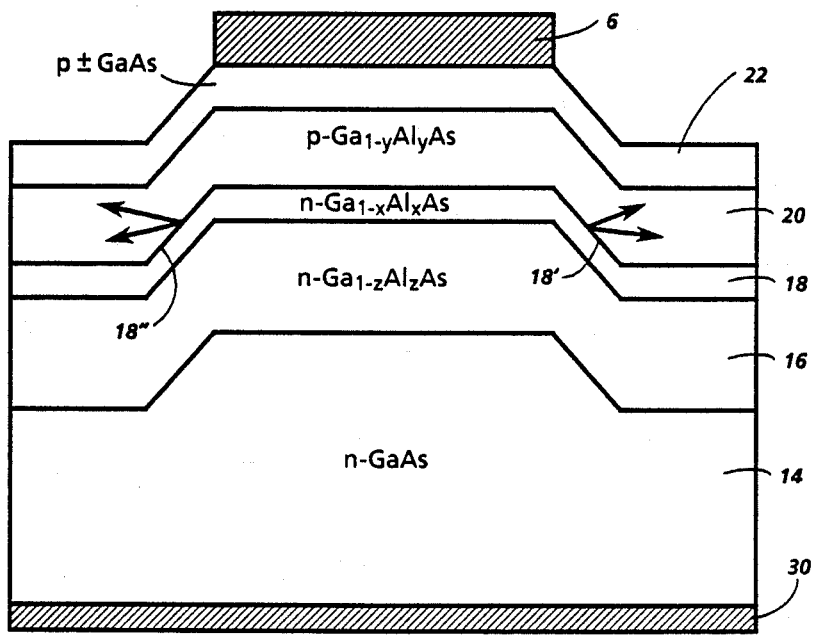

The phase-locked laser previously described utilizes a substrate channel to provide the stepped portions of the active region. As shown in FIG. 4, the stepped active region portions could be provided as the result of a mesa formed in the substrate and layer growth on the mesa, in which cases the transparent waveguides would be on the p-side of the active layer 18. Layer types and thicknesses can be the same as those indicated for corresponding layers of FIG. 2.

Figure 5:
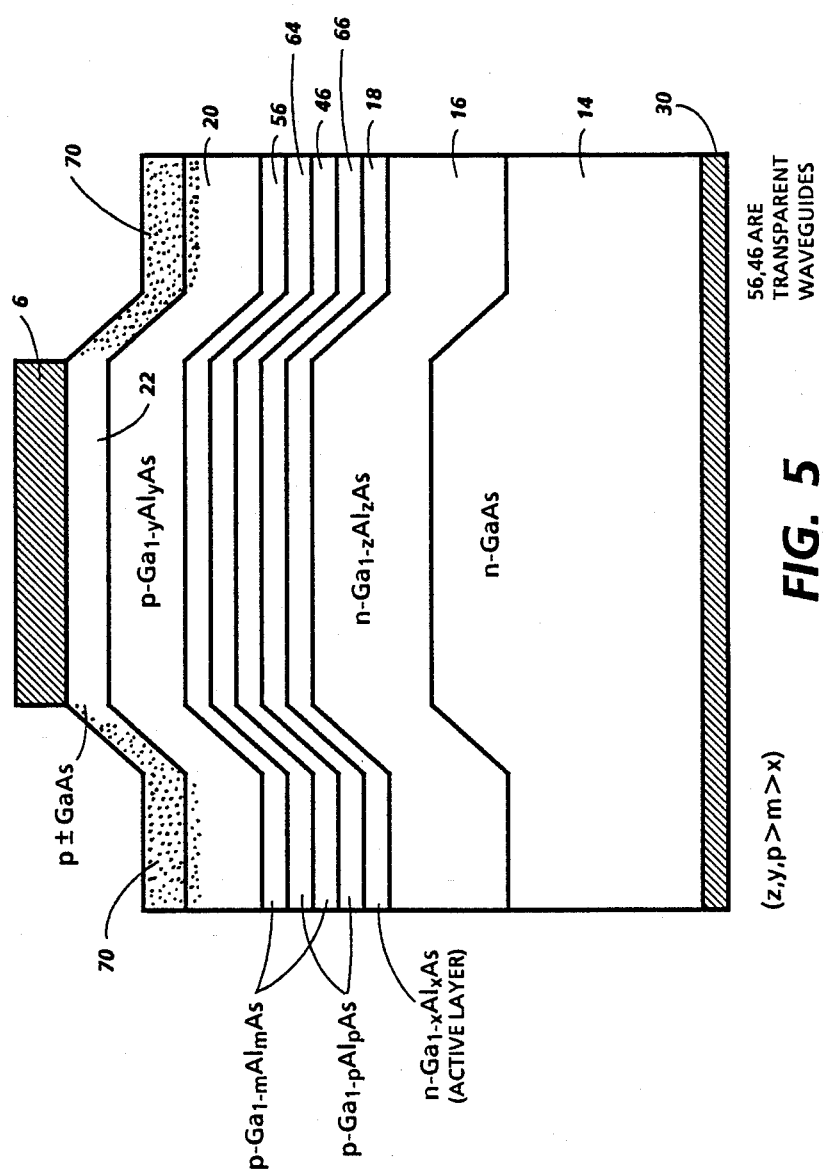

A further design incorporating waveguiding is shown in FIG. 5. Here the transparent waveguide contains multiple waveguide layers 46 and 56, with vertical waveguiding confinement provided by layers 64, 66 and 20 and with proton implanted regions 70 providing current confinement. The thicknesses of the layers 56 and 46 can be quite thin or quite thick (50 Angstroms–0.5 microns) depending on Aluminum content. Layers 64 and 66 can also be thick (0.5 microns) or thin (50 Angstroms) depending on aluminum content. Specifically, layers 46, 56, 64, and 66 can be 0.2 microns, 0.2 microns, 0.1 micron and 0.1 micron, respectively. Layers corresponding to like layers to FIG. 2 can have the compositions and thicknesses indicated for the corresponding layers. The multiple waveguide layers allow coupling of the optical wave from the active layer steps into the waveguide layers more readily since the light emitted through the active layer steps will propagate in the layer(s) with the closest vertical alignment. Thus, multiple waveguide layers will ease any problem of waveguide alignment.

Figure 6:
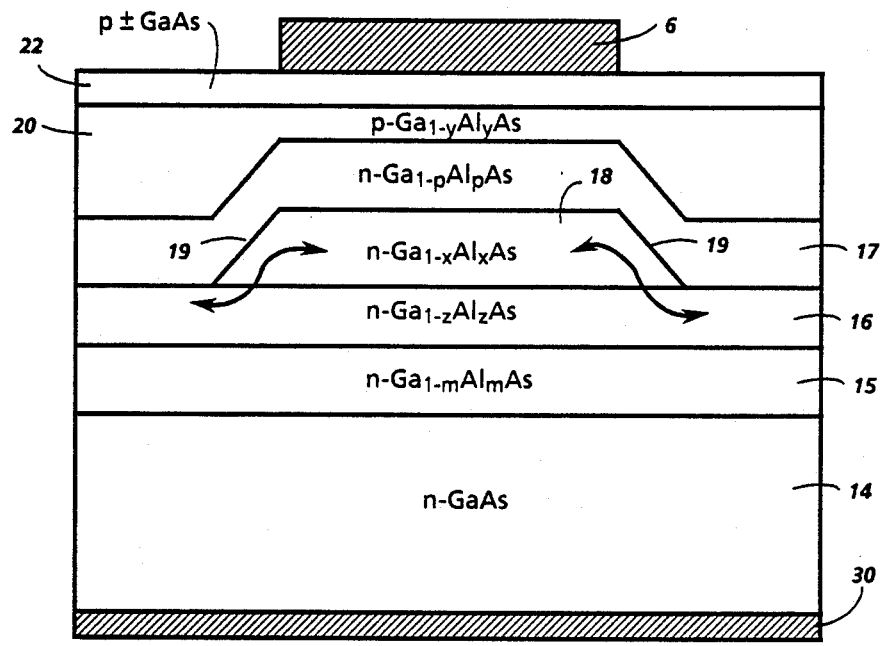

A further design of a multi-emitter laser employing a window waveguide is shown in FIG. 6. In the laser of FIG. 6, the active region has tapered end couplers 19 which facilitate a portion of the propogating radiation developed in the active region 18 penetrating and coupling into the waveguide layer 16 lying beneath the active region 18. Vertical waveguiding is provided by layer 15 and 17, which, along with the other layers, may be of the same composition of corresponding layers of FIG. 3. Further detail regarding lasers with active regions with tapered end couplers is provided in U.S. Pat. No. 4,371,966.

Figure 7:
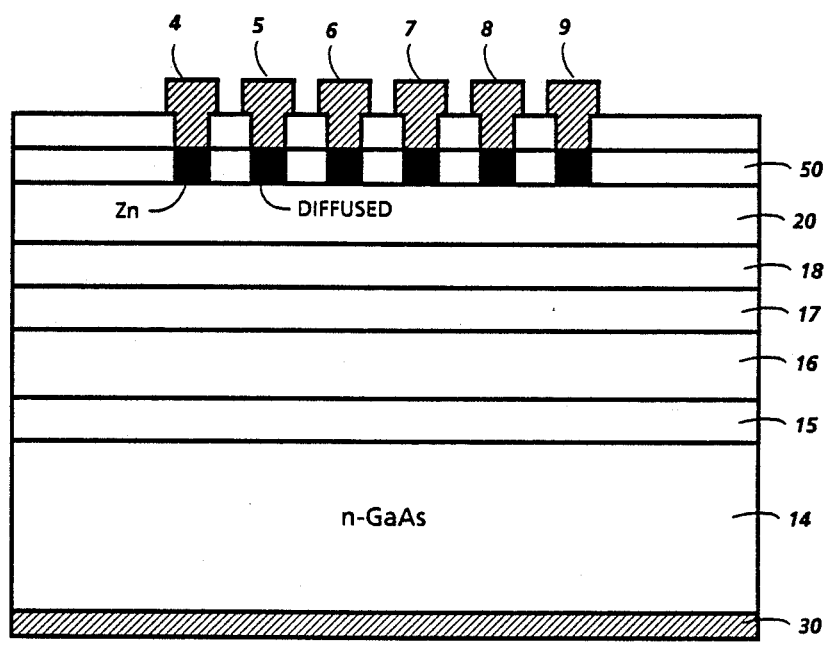
FIG. 7 illustrates an alternative contact structure for the lasers of FIGS. 1a, 1b, 1d, 1e and 1g.

Parallel contact stripes can be provided in a manner different than as illustrated for the lasers previously described. For example, the parallel contact stripes could be achieved by conventional zinc diffusion through an appropriate oxide mask 50, as shown in FIG. 7. Any other current confining stripe configuration can also be utilized as is well known in the art. Furthermore, laser materials other than GaAlAs such as those containing In, Ga, Al, As, P, Sb as well as Pb, Sn, Te, Se can also be used.

Figure 8:
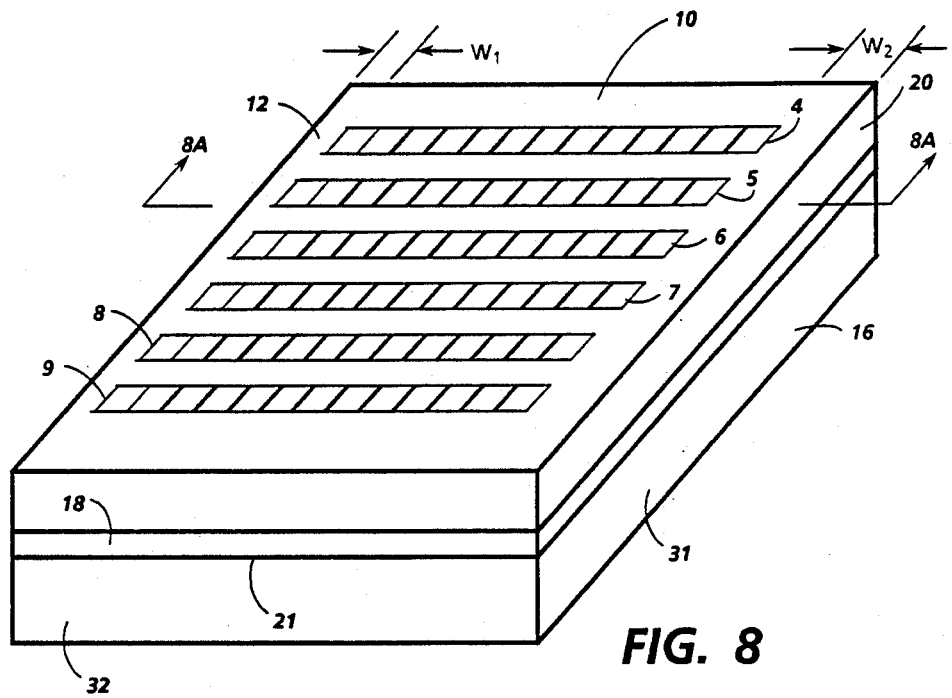
FIGS. 8 and 8a illustrate multi-emitter phase-locked window lasers using lateral real refractive index waveguiding.
Figure 8A:
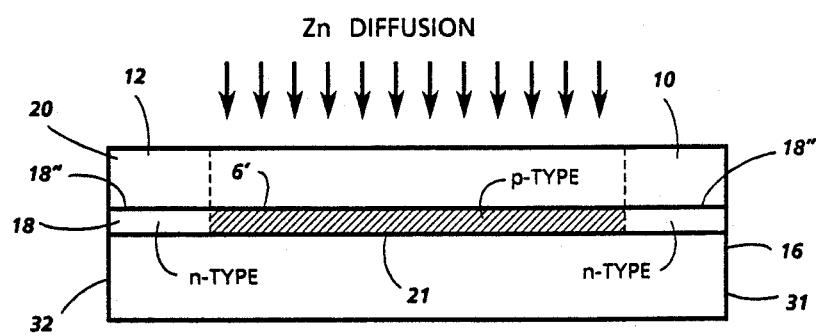

Lateral real refractive index waveguiding in the stripe region can also be used to create the lateral wave diffraction and associated divergence necessary to achieve coupling into adjacent emitters. Such a structure is shown in FIGS. 8 and 8a. In this structure, spaced Zn-diffused regions 4–9 are positioned in the central region of the laser. Regions 4–9 are typically 2–6 microns wide and are separated by approximately 3–25 microns. The Zn-diffused regions 4–9 extend into the originally n-type $Ga_{1-x}Al_xAs$ active region 18 to make laterally spaced p-$Ga_{1-x}Al_xAs$ light-emitting regions (region 6' in FIG. 8a) in active layer 18 upon forward bias of the p-n junction 21. The end portions 18" of the active region 18 adjacent to the laser mirrors 31 and 32 are not made p-type but remain n-type, as indicated in FIG. 8a, to provide window regions 10 and 12. The length of the window regions are typically 10 microns <$W_1$<150 microns. Because they remain n-type, the regions 18" are transparent to radiation generated in the multiple emitters underlying the multiple stripe p-type regions 4–9. Thus, in operation, light is generated in the p-type active region strips. This light is laterally waveguided along the plane of the p-n junction 21 by the impurity profile which creates a real refractive index waveguide. The light emerges from these waveguides and diverges laterally in regions 10 and 12. When this light reflects off mirror surfaces 31 and 32, a portion of the light from one emitter couples into another emitter, phase-locking the laser. High output power is achieved by this multiple emitter configuration. Output power is further improved by the transparent window regions 10 and 12 which allow at least 5 times higher power levels in addition to allowing improved phase locking. Note that several layers shown in FIGS. 2–7, including the substrate and the p-type cap layers, are omitted for simplicity from FIGS. 8 and 8a.

Other types of phase-locked window stripe lasers are also possible. Previously, a number of publications have described various single emitter transparent window lasers, including the "window stripe" laser, the TJS window stripe laser, the passive channel waveguide laser, the LOC BH window laser, the modified strip buried window laser, the embedded stripe laser, and the windowed V-channeled substrate laser, as well as the lasers described in U.S. Pat. No. 4,371,966. Each of these configurations can be modified to include the multiple stripe configurations shown in FIGS. 1a, 1b and 1d-1g which allow the previously unforeseen advantage of diffractive coupling (and therefore phase-locking) between multiple emitters.

Figure 9:
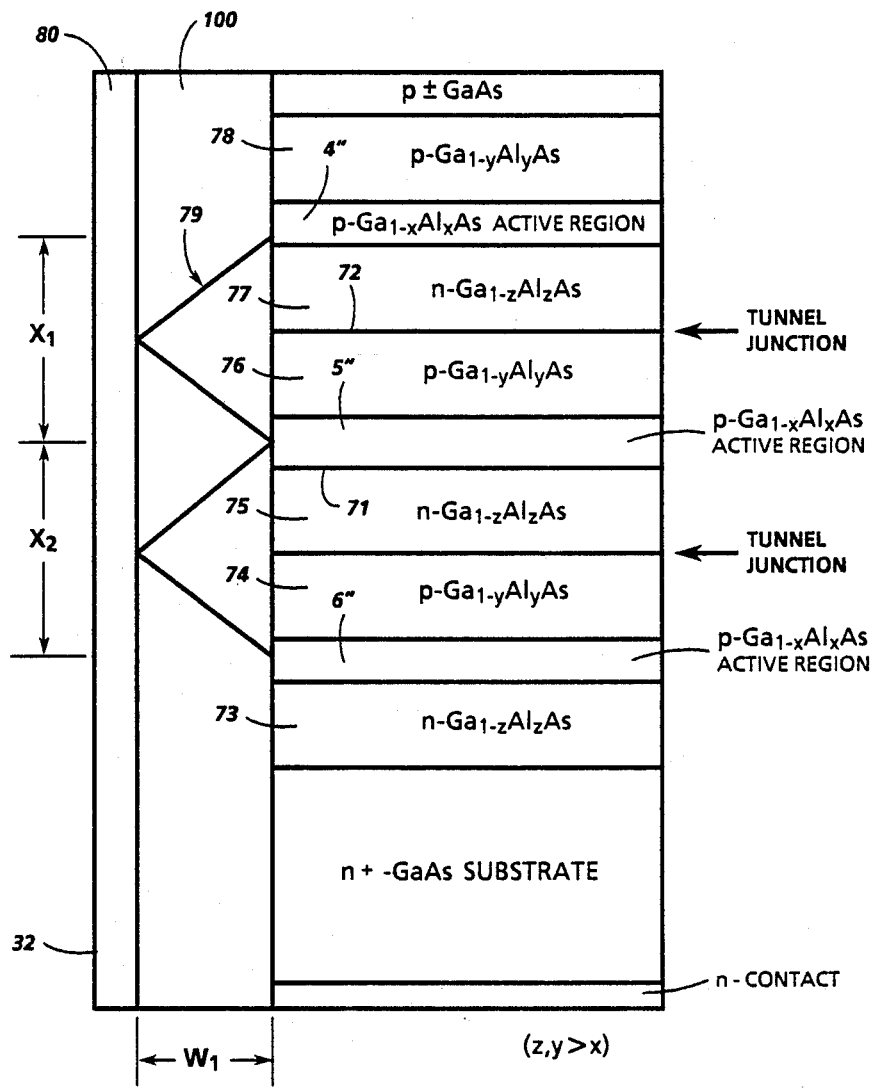
FIG. 9 illustrates a multi-emitter phase-locked window laser where phase-locking is achieved in a direction perpendicular to the laser p-n junction.

A still further configuration which employs a transparent window region to allow coupling of light from spaced emitters is shown in FIG. 9. In this embodiment, the heterostructure device is similar to that shown by Van der Ziel in Applied Physics Letters, 41, 499 (1982). That is, three spaced active layers 4"-6" are grown which are separated by highly doped tunnel junctions 71 and 72. Because of the strong waveguiding of the cladding layers 73-78 and the strongly light absorbing nature of the tunnel junctions 71, 72, it is difficult to couple light from one active layer to another to achieve phase-locked low divergence high power emission. However, if prior to at least one reflecting surface 32 a transparent layer 100 is present and if the thickness $W_1$ of layer 100 is sufficient to allow optical coupling between layers 4"-6" as shown by light rays 79, then phase-locking can be achieved in the direction perpendicular to the plane of the p-n junction as well as along the plane of the p-n junction as shown in FIGS. 2-8. Specifically, the material of layer 100 may be composed of $Al_2O_3$, active layers 4", 5" and 6" may be separated by 1 micron ($X_1=X_2=1$ micron) and the light from each emitter 4"-6" may diverge by as much as 30° in the $Al_2O_3$ material 10. In this case, $W_1$ may be on the order of 0.8 microns to achieve coupling between emitters 4"-6". A reflective layer or layers 80, such as a dielectric stack or metal reflector, can be utilized to achieve greater coupling between lasing regions. For even greater output powers, multiple stripe patterns as shown in FIG. 1 could be formed on the structure of FIG. 9 to achieve a two-dimensional coupled array of lasing regions.

The multi-emitter lasers described thus far utilized only diverging light from multi-emitters pumped by uncoupled parallel stripe contacts and light reflection from the cleaved mirror facets to achieve phase-locking. That phase-locking can be augmented by any of the contact patterns taught by U.S. Pat. No. 4,255,717, such patterns directly deflecting and coupling portions of the optical wave from each lasing cavity into one or more adjacent cavities. In addition, partial coupling may be achieved by evanescent wave coupling between emitters as shown by Scifres et al, Appl. Phys. Lett., 33, 1015 (1978).

We claim:

1. A heterostructure laser including a plurality of heterostructure layers with a p-n junction between at least a pair of said layers, at least one of said layers being an active region, resonant cavity means including a light reflecting surface at opposite edges of said laser, means for providing a plurality of multiple light emitting regions having opposite ends that fall short of said laser edges, means for forward biasing said active region to cause said light emitting regions to emit radiation toward said laser edges, coupler regions formed transversely across said resonant cavity means having respective widths, $W_1$ and $W_2$, respectively extending between said laser edge and said multiple light emitting region end and comprising an integral, unitary transparent window region substantially nonabsorbent to radiation generated in said multiple light emitting regions, said coupler regions to allow radiation from one of said emitting regions to partially couple into one or more of the other of said multiple emitting regions, thereby creating phase-locked output radiation, said coupler regions characterized in that they are not of the same width ($W_1 \neq W_2$) so as to produce variations in the degree and phase of coupling between said multiple light emitting regions.

2. The heterostructure laser of claim 1 further characterized in that at least some of said multiple light emitting regions are of different lengths.

3. The heterostructure laser of claim 1 further characterized in that at least some of said multiple light emitting regions are of different spatial separation from one another.

4. A heterostructure laser including a plurality of heterostructure layers with a p-n junction between at least a pair of said layers, at least one of said layers being an active region, resonant cavity means including a light reflecting surface at one edge of said laser, means for forward biasing said active region for providing a plurality of multiple light emitting regions that emit radiation toward said edge of said laser, at least one coupler region formed transversely across a portion of said resonant cavity means and comprising an integral, unitary transparent window region substantially nonabsorbent to radiation generated in said multiple light emitting regions to allow radiation from one of said multiple emitting regions to partially couple into one or more of the other of said multiple emitting regions, thereby creating phase-locked output radiation, said laser characterized in that at least some said multiple light emitting regions are of different lengths and terminate at and within said coupler region.

5. A heterostructure laser including a plurality of heterostructure layers with a p-n junction between at least a pair of said layers, at least one of said layers being an active region, resonant cavity means including a light reflecting surface at one edge of said laser, means for forward biasing said active region for providing a plurality of multiple light emitting regions that emit radiation toward said edge of said laser, at least one coupler region formed transversely across a portion of said resonant cavity means and comprising an integral, unitary transparent window region substantially nonabsorbent to radiation generated in said multiple light emitting regions to allow radiation from one of said multiple emitting regions to partially couple into one or more of the other of said multiple emitting regions, thereby creating phase-locked output radiation, said laser characterized in that at least some said multiple light emitting regions are of different widths.

6. The heterostructure laser of claim 5 further characterized in that at least some of said multiple light emitting regions are of different lengths.

7. The heterostructure laser of claim 5 further characterized in that at least some of said multiple light emitting regions are of different spatial separation from one another.

8. A heterostructure laser including a plurality of heterostructure layers with a p-n junction between at least a pair of said layers, at least one of said layers being an active region, resonant cavity means including a light reflecting surface at opposite edges of said laser, means for providing a plurality of multiple light emitting regions having opposite ends that fall short of said laser edges, means for forward biasing said active region to cause said light emitting regions to emit radiation toward said laser edges, coupler regions formed transversely across said resonant cavity means having respective widths, $W_1$ and $W_2$ wherein $W_1 = W_2$, respectively extending between said laser edge and said multiple light emitting region end and comprising an integral, unitary transparent window region substantially nonabsorbent to radiation generated in said multiple light emitting regions, said coupler regions to allow radiation from one of said emitting regions to partially couple into one or more of the other of said multiple emitting regions, thereby creating phase-locked output radiation, said laser characterized in that said multiple light emitting regions are of different widths.

9. The heterostructure laser of claim 8 further characterized in that at least some of said multiple light emitting regions are of different lengths.

10. The heterostructure laser of claim 8 further characterized in that at least some of said multiple light emitting regions are of different spatial separation from one another.

11. The heterostructure laser of claim 8 wherein said coupler regions are further characterized in that they are not of the same width ($W_1 \neq W_2$) so as to produce variations in the degree and phase of coupling between said multiple light emitting regions.

12. A heterostructure laser including a plurality of heterostructure layers with a p-n junction between at least a pair of said layers, at least one of said layers being an active region, resonant cavity means including a light reflecting surface at one edge of said laser, means for forward biasing said active region for providing a plurality of multiple light emitting regions that emit radiation toward said edge of said laser, at least one coupler region formed transversely across a portion of said resonant cavity means and comprising an integral, unitary transparent window region substantially nonabsorbent to radiation generated in said multiple light emitting regions to allow radiation from one of said multiple emitting regions to partially couple into one or more of the other of said multiple emitting regions to partially couple into one or more of the other of said multiple emitting regions, thereby creating phase-locked output radiation, said laser characterized in that said window region comprises a vertical confining waveguide mechanism having a thickness greater than the thickness of said active region permitting the divergence of radiation in said window region for reflection and coupling into other light emitting regions while concurrently permitting higher output power levels to be attained without substantial increase in lasing threshold.

13. The heterostructure laser of claim 12 wherein said window region is formed at each end of said laser between said light reflecting surface and ends of said multiple light emitting regions.

14. The heterostructure laser of claim 12 wherein said vertical confining waveguide mechanism is 10 to 20 times thicker than said active region.

15. A heterostructure laser including a plurality of heterostructure layers with a p-n junction between at least a pair of said layers, at least one of said layers being an active region, resonant cavity means including a light reflecting surface at one edge of said laser, means for forward biasing said active region for providing a plurality of multiple light emitting regions that emit radiation toward said edge of said laser, at least one coupler region formed transversely across a portion of said resonant cavity means to allow radiation from one of said multiple emitting regions to partially couple into one or more of the other of said multiple emitting regions, thereby creating phase-locked output radiation, said laser characterized in that said light emitting regions are electrically pumped via narrow current confinement means concurrently with the pumping of said window region, the pumped area of said window region being larger than the area of said current confinement means so that the average charge density is higher in said window region compared to the peak charge density in said current confinement means to render said window region substantially nonabsorbent to radiation generated in said multiple light emitting regions.

* * * * *